(12) United States Patent
Chin et al.

(10) Patent No.: US 8,018,299 B2
(45) Date of Patent: Sep. 13, 2011

(54) BAND-PASS FILTER CIRCUIT AND MULTI-LAYER STRUCTURE AND METHOD THEREOF

(75) Inventors: Kuo Chiang Chin, Taipei County (TW); Chang Lin Wei, Hsinchu (TW); Cheng Hua Tsai, Taipei County (TW); Wei Ting Chen, Tainan County (TW); Li Chi Chang, Taichung (TW); Chang Sheng Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 171 days.

(21) Appl. No.: 12/410,096

(22) Filed: Mar. 24, 2009

(65) Prior Publication Data

US 2010/0026420 A1  Feb. 4, 2010

(30) Foreign Application Priority Data

Jul. 29, 2008  (TW) ................................ 97128570 A

(51) Int. Cl.
 *H03H 7/01* (2006.01)
(52) U.S. Cl. ...................................... 333/175; 333/185

(58) Field of Classification Search .................. 333/167, 333/175, 176, 185, 204
See application file for complete search history.

(56) References Cited

U.S. PATENT DOCUMENTS

| | | | |
|---|---|---|---|
| 5,373,271 A * | 12/1994 | Hirai et al. ..................... 333/205 |
| 6,064,281 A | 5/2000 | Sheen | |
| 6,504,451 B1 * | 1/2003 | Yamaguchi ................... 333/177 |
| 6,590,473 B1 * | 7/2003 | Seo et al. ....................... 333/185 |
| 7,099,645 B2 | 8/2006 | Shingaki et al. | |
| 7,109,829 B2 | 9/2006 | Kosaka et al. | |
| 7,136,274 B2 | 11/2006 | Hwang et al. | |
| 7,262,674 B2 | 8/2007 | Kamgaing | |
| 7,262,675 B2 | 8/2007 | Lee et al. | |
| 2007/0241839 A1 * | 10/2007 | Taniguchi ...................... 333/185 |
| 2008/0100401 A1 * | 5/2008 | Cho et al. ....................... 333/204 |

* cited by examiner

*Primary Examiner* — Seungsook Ham
(74) *Attorney, Agent, or Firm* — WPAT, P.C.; Anthony King

(57) ABSTRACT

A band-pass filter includes a plurality of resonators, a feedback capacitive device and a grounding inductance device. A first end of each resonator is connected to a first node, and a second end of each resonator is connected to a second node. The feedback capacitive device is formed on the feedback circuit from the first node to the second node. The grounding inductance device is connected to the second node and ground. In an embodiment, the resonator essentially consists of a capacitive device and an inductance device.

23 Claims, 6 Drawing Sheets

BAND-PASS FILTER CIRCUIT AND MULTI-LAYER STRUCTURE AND METHOD THEREOF

BACKGROUND OF THE INVENTION (A) Field of the Invention

The present invention is related to a band-pass filter circuit and multi-layer structure thereof to increase rejection of the band-pass filter, and the related method for increasing the rejection.

(B) Description of the Related Art

It is commonly known that critical roles in modern communications systems are played by a range of radio frequency (RF) passive devices, such as inductors, capacitors, resistors, antennas, or balanced-to-unbalanced transformers. These are essential devices in a wireless communication system. The RF band-pass filter is usually the most crucial device among the RF front-end circuits, and is used for selecting the signals in the required band and providing attenuation to noise sources outside the pass-band. In a communication system, the filter is typically placed after an antenna and before a low-noise amplifier. A superior RF band-pass filter must have low insertion loss in the pass-band and high attenuation outside the pass-band. In the past ten years, in view of rapid development of handheld mobile apparatuses and wireless networks, the RF band-pass filter has become rapidly commercialized and enjoys high industry demand. Therefore, according to recent trends of reduction in size and weight of electronic devices, RF band-pass filters with superior electrical performance and minimal size are in great demand in the market.

RF band-pass filters are important in wireless communication systems. Because noises and interferences are severe in wireless transmission channels, the system needs to rely on a band-pass filter placed at a front end to suppress the interferences of image and harmonic signals. Therefore, a crucial consideration of filter design is how to increase the rejection ability of the filter outside the pass-band.

U.S. Pat. No. 7,109,829 discloses a three-order band-pass filter, which uses multiple cross-coupling paths between resonators to generate transmission zeros outside the pass-band. The frequency response of the filter show one transmission zero at low skirt and two transmission zeros at high skirt. This system is concise, but the coupling mechanism between resonators is not easily controlled so that the precise positioning of transmission zeros is also difficult to control.

SUMMARY OF THE INVENTION

In the development of RF band-pass filter technology, the focus of research has gradually shifted from the response in the passband to the response outside the pass-band. When the system suffers various noises and interferences in the spectrum, the stopband rejection of the RF band-pass filter becomes important. The present invention provides a novel RF band-pass filter structure and an architecture thereof capable of increasing the rejection of the RF band-pass filter outside the passband. In addition, the RF band-pass filter can be implemented by multilayer substrates processes, such as a multilayer printed circuit board process or a multilayer ceramic substrate process.

The present invention discloses a band-pass filter circuit including a plurality of resonators, a feedback capacitive device and a grounding inductive device. Each of the resonators has a first end connected to a first node and a second end connected to a second node. The feedback capacitive device is placed in a feedback circuit from the first node to the second node. The grounding inductive device has an end connected to the second node and another end connected to ground.

In an embodiment presented here, the resonator includes a capacitive device and an inductive device.

The band-pass circuit can be implemented by a multilayer circuit boards process, and, from top to bottom, includes a first circuit board layer, a second circuit board layer, a third circuit board layer, a fourth circuit board layer and a fifth circuit board layer. The second circuit board layer includes the upper electrodes of the capacitive devices of the resonators; the third circuit board layer includes the lower electrodes of the capacitive devices of the resonators; and the fifth circuit board layer includes inductance devices of the resonators. A system ground plane is formed at the lower surface of the fifth circuit board layer.

To increase the stopband rejection of the band-pass filter, a method is performed essentially as follows. A plurality of resonators are formed between two signal ports and the resonators are connected in parallel, where an end of each resonator is connected to a first node, and another end of each resonator is connected to a second node. A feedback circuit including a capacitive device is formed from the first node to the second node. An inductive device connects the second node and the ground.

DETAILED DESCRIPTION OF THE INVENTION

The present invention will be explained with the appended drawings to clearly disclose the technical characteristics of the present invention.

To avoid noise interference and harmonic distortion in a wireless communication system, a RF band-pass filter device of high rejection is demanded.

Figure 1:
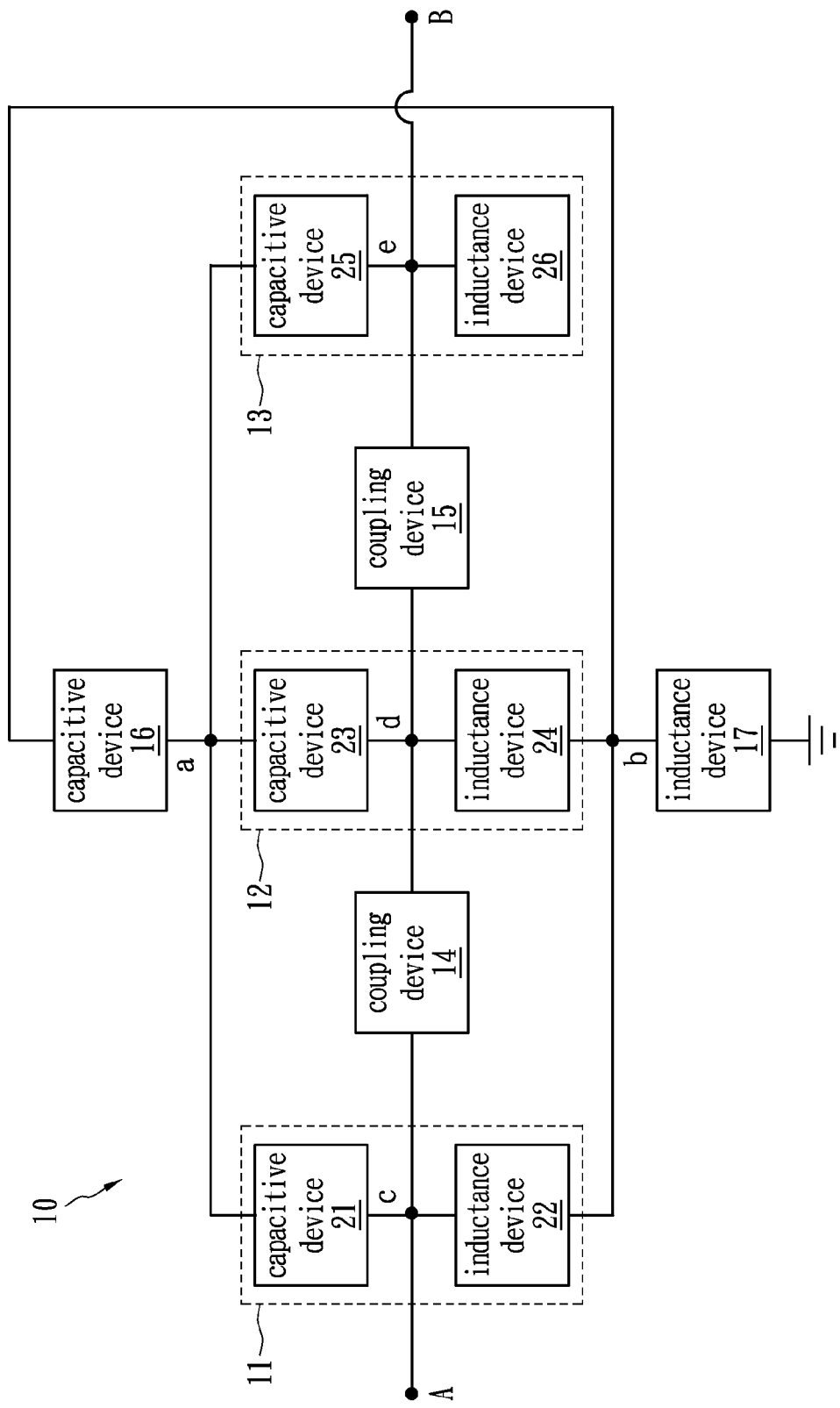
FIG. 1 shows a block diagram of a band-pass filter in accordance with the present invention.

FIG. 1 shows a block diagram of a band-pass filter of the present invention. A band-pass filter 10 essentially includes a first resonator 11, a second resonator 12, a third resonator 13, a first coupling capacitive device 14, a second coupling capacitive device 15, a feedback capacitive device 16, and a grounding inductive device 17. The first coupling device 14 is connected between the first resonator 11 and the second resonator 12, while the second coupling device 15 is connected between the second resonator 12 and the third resonator 13. One end of each of the first, second, and third resonators 11, 12 and 13 is connected to a first node "a" and the other end is connected to a second node "b." The feedback capacitive device 16 is connected between node "a" and node "b" in the feedback circuit. Node "b" is further connected to the grounding inductive device 17. The first resonator 11 and the third resonator 13 are respectively connected to the two signal input and output ports A and B of the band-pass filter 10. The band-pass filter has higher stopband rejection by the arrangement of the resonators 11, 12 and 13 and the feedback circuit.

The resonance frequencies of the first, second and third resonators 11, 12 and 13 may be the same or different. The first coupling capacitive device 14 and the second coupling capacitive device 15 can be implemented in different types of capacitor such as a metal-insulation-metal (MIM) capacitor, a vertical-interdigital capacitor (VIC), a surface-mounted device (SMD) capacitor or the like, and the capacitance can be the same or different. In addition, the electrodes of the capacitors can be formed by plural electrode plates.

In an embodiment, the first resonator 11 includes a capacitive device 21 and an inductive device 22; the second resonator 12 includes a capacitive device 23 and an inductive device 24; the third resonator 13 includes a capacitive device 25 and an inductive device 26. The capacitive devices 21, 23 and 25 are connected to node "a" (first end), and the inductance devices 22, 24 and 26 are connected to node "b" (second end). The first coupling capacitive device 14 is connected to a node "c" (intermediate end) between the capacitive device 21 and the inductance device 22 and a node "d" between the capacitive device 23 and the inductive device 24. Node "c" is connected to the signal port A. The second coupling capacitive device 15 is connected to node "d" between the capacitive device 23 and the inductive device 24 and a node "e" between the capacitive device 25 and the inductive device 26. Node "e" is connected to the signal port B.

Figure 2:
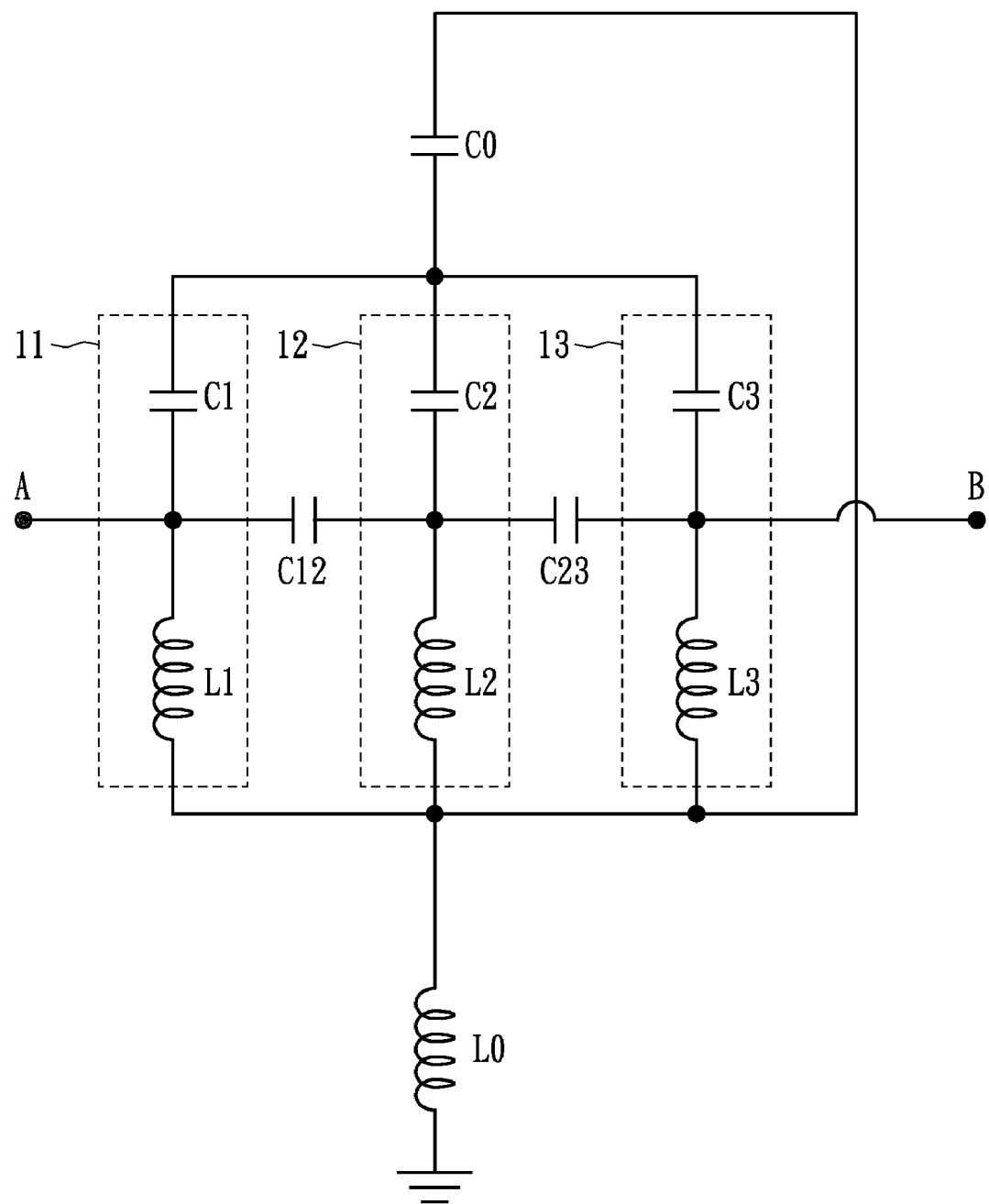
FIG. 2 shows a band-pass filter circuit in accordance with an embodiment of the present invention.

Referring to FIG. 2, according to the embodiment, the first resonator 11 includes a capacitor C1 and an inductor L1; the second resonator 12 includes a capacitor C2 and an inductor L2; and the third resonator 13 includes a capacitor C3 and an inductor L3. The coupling capacitive devices 14 and 15 between two resonators respectively include coupling capacitors C12 and C23. The feedback capacitive device 16 is composed of a capacitor C0, and the grounding inductance device 17 is composed of an inductor L0.

In practice, the present invention provides a novel multilayer filter structure. The substrate containing band-pass filter structure is derived from the concept of the third-order combline band-pass filter.

A typical 2/2/2 printed circuit board process is proposed for implementing the multilayer band-pass filter with high rejection. However, the band-pass filter may be formed by different processes and different architectures; they all are within the scope of the present invention.

Figure 3:
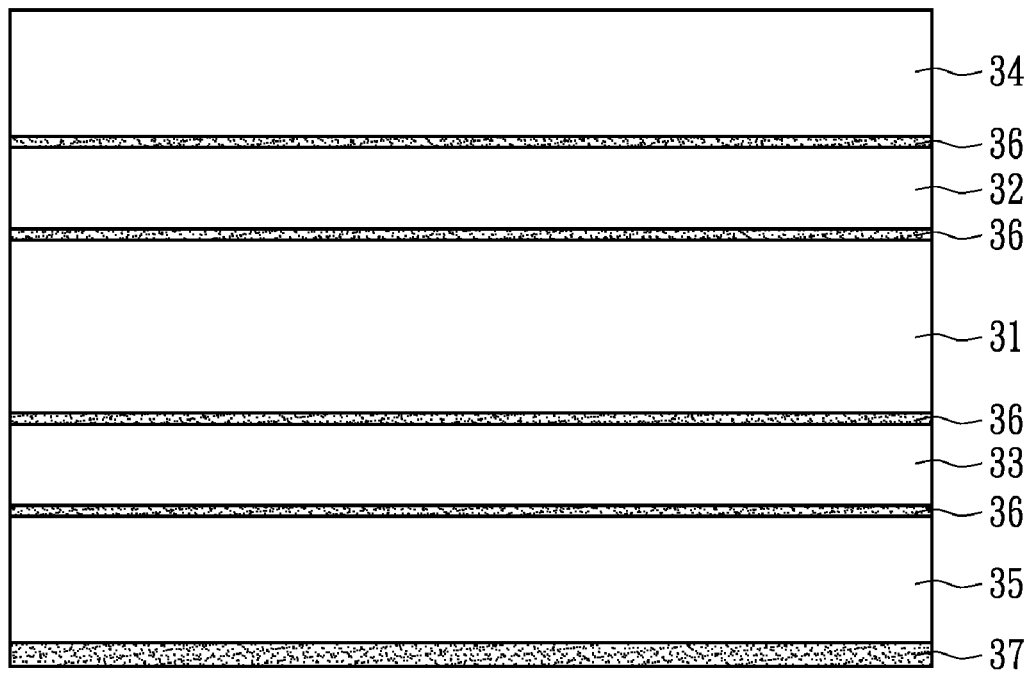
FIGS. 3 through 5 show a multi-layer band-pass filter structure in accordance with an embodiment of the present invention.

The proposed architecture of this embodiment is shown in FIG. 3. There is an architecture of six layers including five circuit board layers 31-35 and a grounded layer 37. The circuit board layers 31-35 include a BT substrate serving as a core layer, two high dielectric constant substrates (organic/inorganic hybrid polymeric materials) and two low loss substrates serving as outer layers. FIG. 3 shows from top to bottom a first circuit board layer 34, a second circuit board layer 32, a third circuit board layer 31, a fourth circuit board layer 33 and a fifth circuit board layer 35. Each of the circuit board layers 31-35 may be provided with a metal layer 36 for electrical conduction. The bottom system ground plane 37 serves as a system ground plane for the filter.

Figure 4A:
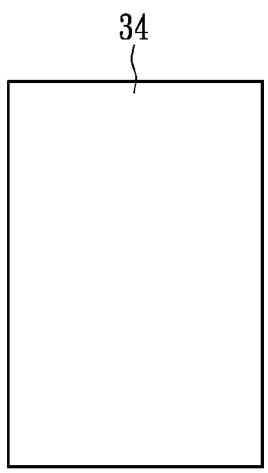
Figure 4B:
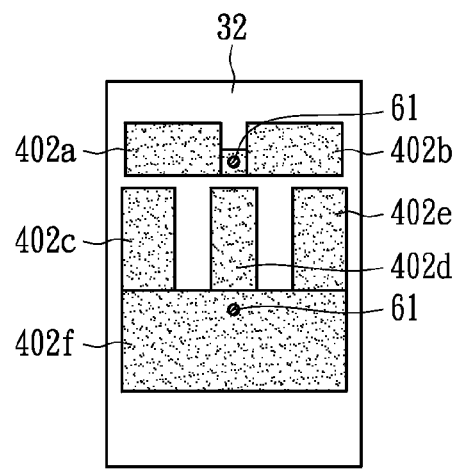
Figure 4C:
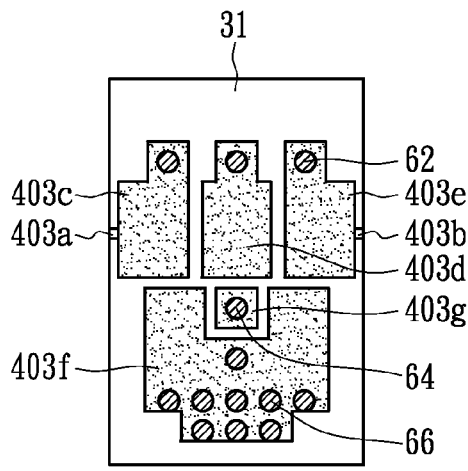
Figure 4D:
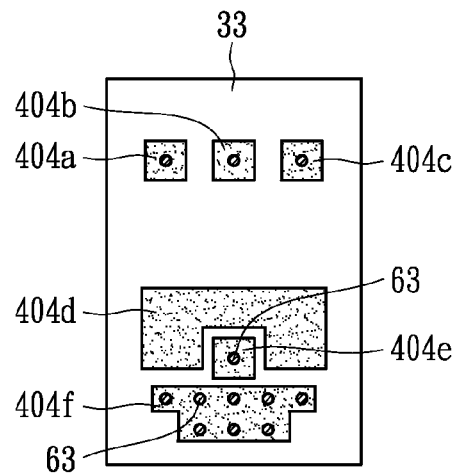
Figure 4E:
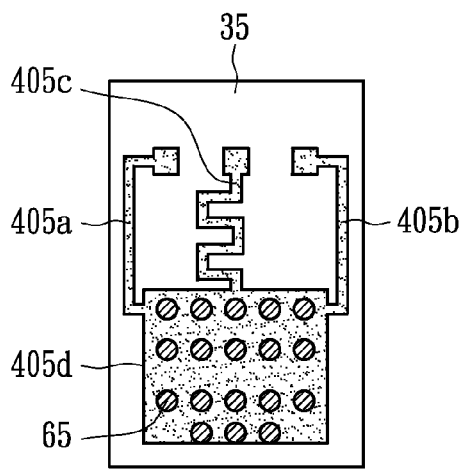
Figure 4F:
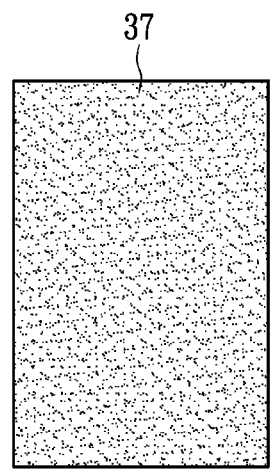
Figure 5:
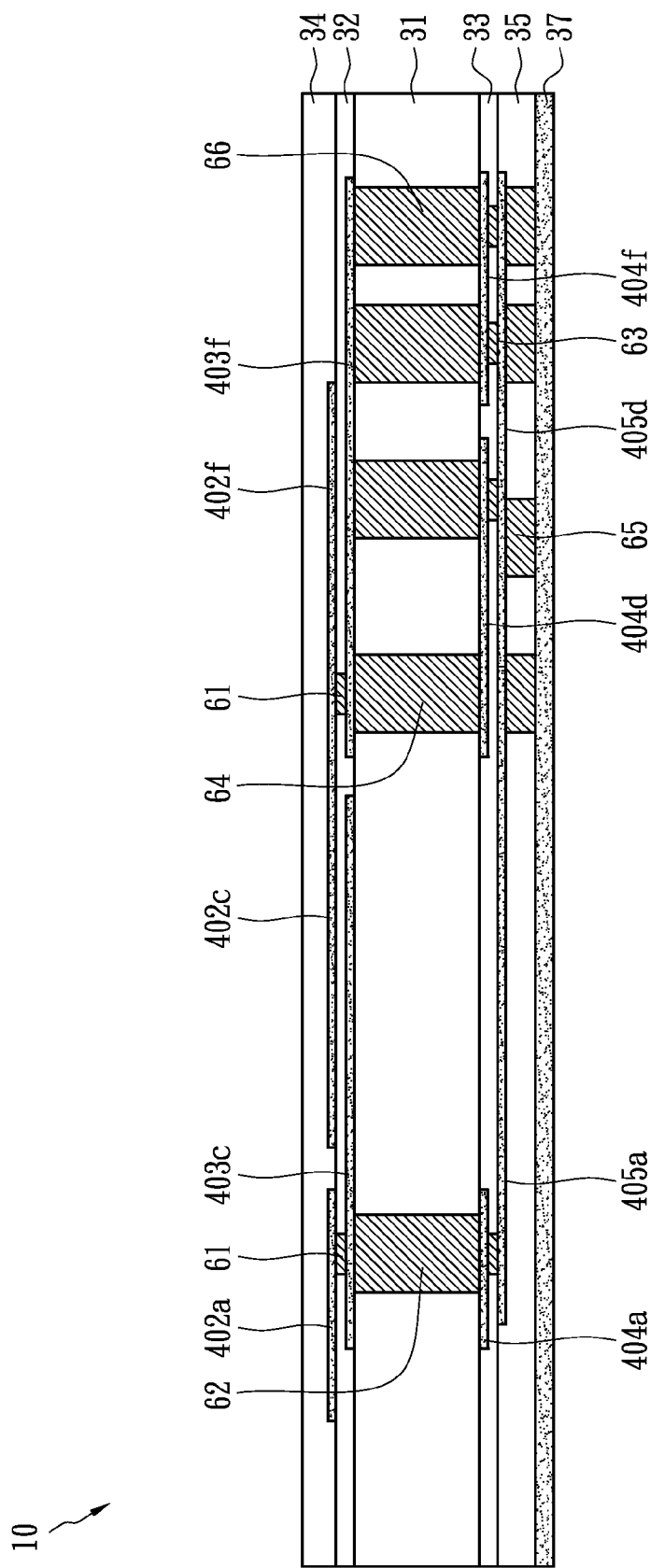

FIGS. 4A through 4E show physical layouts of the first circuit board layer 34, the second circuit board layer 32, the third circuit board layer 31, the fourth circuit board layer 33 and the fifth circuit board layer 35, respectively. FIG. 4F shows the system ground plane 37 serving as a system grounding plane. FIG. 5 is the side view of the integrated structure corresponding to those shown in FIG. 4A to 4F. The signal input and output ports are conductive layers 403a and 403b shown in FIG. 4C. The C1, C2 and C3 of the band-pass filter are respectively formed by three MIM capacitors, i.e., the three sets of conductive layers 402c and 403c, 402d and 403d, and 402e and 403e shown in FIG. 4B and FIG. 4C. The L1, L2 and L3 of FIG. 2 are formed by the conductive layers 405a, 405c and 405b of the substrate 405 of FIG. 4E. The conductive layers 405a, 405b and 405c serving as inductors are formed by buried microstrip lines. Moreover, the device is downsized by forming tortuous transmission lines. The first resonator 11 includes conductive layers 402c, 403c and 405a, in which 402c and 403c respectively use conductive holes 61 and 62 to be connected to the two ends of the inductor 405a. Like the first resonator 11, the second resonator 12 includes conductive layers 402d, 403d and 405c, and the third resonator 13 includes 402e, 403e and 405b. The 402d and 403d, 402e and 403e use conductive holes 61 and 62 to be respectively connected to the two ends of the inductors 405c and 405b. The coupling capacitor C12 between the first resonator 11 and the second resonator 12 and the coupling capacitor C23 between the second resonator 12 and the third resonator 13 are formed by the parallel-plate capacitors of conductive layer 402a and 403c, and 402b and 403e, respectively. Moreover, the conductive layers 402a and 402b are connected to 403d through the conductive holes 61. As such, the coupling capacitors C12 and C23 between resonators of FIG. 2 can be implemented by the conductive layers 402a, 402b, 403c, 403d and 403e. The capacitors are not restricted to MIM capacitor type, and can be formed by connecting plural electrodes in parallel.

The feedback capacitor C0 connected in parallel in FIG. 2 can be implemented in an MIM capacitor type, in which the conductive layers 402f, 403f, 403g, 404d, 404e, 404f and 405d in connection with the conductive layers 402c, 402d, 402e form a vertical multilayer MIM capacitor. The conductive layers 402f and 404d are connected through conductive holes 61 and 64. The conductive layers 403f and 404f, 405d are connected through conductive holes 63 and 66. The multilayer MIM capacitor uses two high dielectric constant material layers 31 and 32 thereby performing specific features of the process. Moreover, the feedback capacitor is composed of four electrode plates. The second circuit board layer 32 includes a first electrode plate 402f of the feedback capacitor, the third circuit board layer 31 includes the second electrode plates 403f of the feedback capacitor, the fourth circuit board layer 33 includes the third electrode plate 404d of the feedback capacitor, and the fifth circuit board layer 35 includes the fourth electrode 405d of the feedback capacitor, thereby providing sufficient feedback capacitance to the band-pass filter with high rejection.

The grounded coupling inductor L0 shown in FIG. 2 can be formed by connecting the conductive layer 405d and the system ground plane 37 through plural conductive holes 65 or at least one conductive hole 65. By connecting plural conductive holes in parallel to form the inductor L0, the inductance of L0 can be easily controlled through adjusting the number of the conductive holes.

The circuit layouts 402a-402f, 403a-403g, 404a-404f and 405a-405d are formed by the metal layers 36 in FIG. 2.

In addition to the MIM type, the capacitors or the capacitive devices can also be of VIC type, or implemented by an SMD type in part or in total. The inductance devices can be formed by striplines, microstrip lines, buried microstrip lines or other transmission line structures. The inductive devices can be made of spiral type, meander type, or other arbitrary tortuous type to achieve miniaturization, and can be of SMD type in part or in total.

The present invention can be applied to ceramic substrate or IC carrier substrate fields in addition to the printed circuit board.

Figure 6:
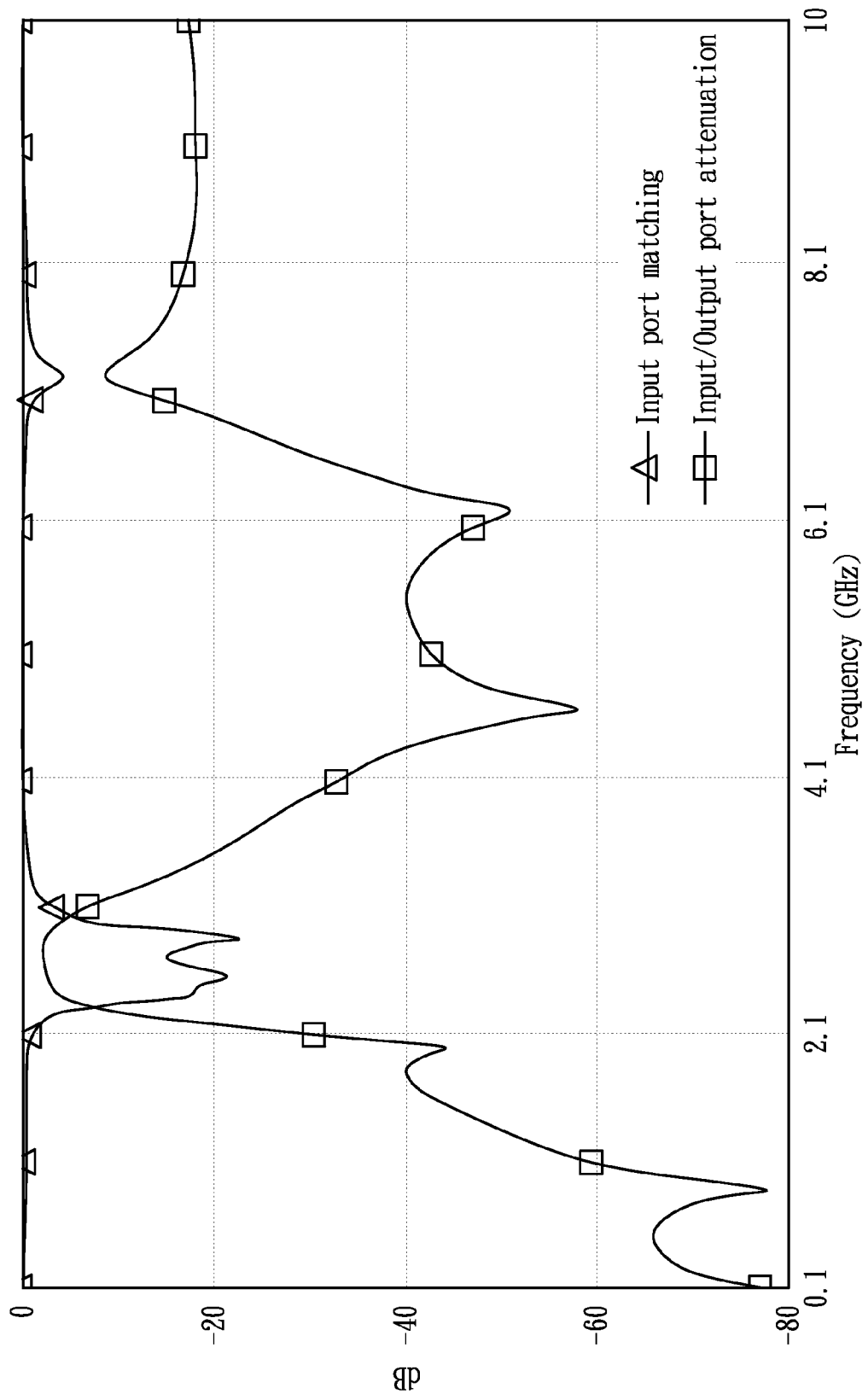
FIG. 6 shows the performance of a band-pass filter circuit in accordance with an embodiment of the present invention.

The band-pass filter 10 is simulated by high frequency all wave electromagnetic simulation software Ansoft HFSS, and the simulation result is shown in FIG. 6. As shown in FIG. 6, the band-pass filter has four transmission zeros at 0.87 GHz, 1.97 GHz, 4.62 GHz and 6.16 GHz. The band-pass filter can provide around 60 dB attenuation at 1 GHz, 40 dB attenuation at 1 GHz to 2 GHz, and around 40 dB attenuation at 4.32 GHz to 6.35 GHz. In view of the simulation result, the band-pass filter of the present invention has superior rejection outside the pass-band. Moreover, from the electromagnetic simulation response of the filter, the maximum insertion loss in the band 2.5 GHz to 2.7 GHz is around 2.6 dB, and the return loss in the pass-band can meet the demand of larger than 15 dB.

The band-pass filter can be implemented by different processes such as low-temperature cofired ceramics (LTCC), high-temperature cofired ceramics (HTCC), multilayer IC carrier substrates, thin-film process or the like. The inductive and capacitive devices may be multilayer structures, and implemented by lump elements or distributed elements in part or in total.

The above-described embodiments of the present invention are intended to be illustrative only. Numerous alternative embodiments may be devised by those skilled in the art without departing from the scope of the following claims.

What is claimed is:

1. A band-pass filter circuit, comprising:
   a plurality of resonators, each resonator having a first end connecting to a first node, a second end connecting to a second node, and an intermediate end between the first end and the second end, wherein the intermediate end of one resonator is electrically connected to the intermediate end of an adjacent resonator;
   a feedback device disposed in a feedback circuit from the first node to the second node; and
   a grounding device having an end connecting to the second node and another end being grounded.

2. The band-pass filter circuit of claim 1, wherein the feedback device is a capacitor and the grounding device is an inductor.

3. The band-pass filter circuit of claim 1, wherein the resonator comprises a capacitive device and an inductive device.

4. The band-pass filter circuit of claim 3, wherein the capacitive device and the inductance device are connected in parallel.

5. The band-pass filter circuit of claim 3, wherein the feedback device is connected to the first node and the inductive device is connected to the second node.

6. The band-pass filter circuit of claim 1, wherein two of the resonators are respectively connected to a signal input port and a signal output port.

7. The band-pass filter circuit of claim 1, wherein two adjoining resonators are electrically connected in a capacitive coupling manner.

8. The band-pass filter circuit of claim 7, further comprising at least one coupling capacitive device connected between the two adjoining resonators.

9. The band-pass filter circuit of claim 1, which has a plurality of transmission zeros outside the passband of the band-pass filter.

10. A multilayer structure of a band-pass filter comprising a plurality of resonators, a feedback capacitive device and a grounding inductive device, the multilayer structure from top to bottom comprising:
    a first circuit board layer;
    a second circuit board layer comprising upper electrodes of capacitive devices of the plurality of resonators and a first electrode of the feedback capacitive device;
    a third circuit board layer comprising lower electrodes of capacitive devices of the plurality of resonators and a second electrode of the feedback capacitive device;
    a fourth circuit board layer comprising a third electrode of the feedback capacitive device;
    a fifth circuit board layer comprising inductive devices of the plurality of resonators and a fourth electrode of the feedback capacitive device; and
    a system ground plane placed on a lower surface of the fifth circuit board layer.

11. The multilayer structure of claim 10, wherein the lower electrodes of the capacitive devices of the plurality of resonators are connected to the inductive devices by conductive holes.

12. The multilayer structure of claim 10, wherein the feedback capacitive device comprises four electrodes having the first electrode included in the second circuit board layer, the second electrode included in the third circuit board layer, the third electrode included in the fourth circuit board layer and the fourth electrode included in the fifth circuit board layer.

13. The multilayer structure of claim 12, wherein the first electrode and the third electrode, and the second electrode and the fourth electrode are electrically connected in pairs through conductive holes.

14. The multilayer structure of claim 12, wherein the fourth electrode is connected to the system ground plane through conductive holes to form a grounding inductive device.

15. The multilayer structure of claim 10, wherein the band-pass filter further comprises at least one coupling capacitive device connected between two adjoining resonators, the second circuit board layer further comprises an upper electrode of the coupling capacitive device; and the third circuit board layer further comprises a lower electrode of the coupling capacitive device.

16. The multilayer structure of claim 15, wherein the lower electrode of the coupling capacitive device is connected to the inductance devices through conductive holes.

17. The multilayer structure of claim 10, wherein the fifth circuit board layer comprises conductive holes connecting the inductive devices and the system ground plane.

18. The multilayer structure of claim 15, wherein the coupling capacitive device is of metal-insulation-metal capacitor, vertical interdigital capacitor or surface-mounted capacitor.

19. The multilayer structure of claim 10, wherein the inductive devices use striplines, microstrip lines or buried microstrip lines.

20. A method for increasing rejection of a band-pass filter, comprising the steps of:

forming a plurality of resonators between a signal input and a signal output, where the plurality of resonators are connected in parallel with an end connecting to a first node and another end connecting to a second node;

wherein a first resonator includes an intermediate end between the first node and second node, and the intermediate end of the first resonator is connected to the signal input; wherein a last resonator includes an intermediate end between the first node and second node, and the intermediate end of the last resonator is connected to the signal output;

forming a feedback circuit with a capacitive device between the first node and the second node; and forming an inductive device connected to the second node and being grounded.

21. The method for increasing rejection of a band-pass filter of claim 20, wherein the plurality of resonators are electrically connected in a capacitive coupling manner.

22. The method for increasing rejection of a band-pass filter of claim 20, wherein the band-pass filter is implemented by a multilayer ceramic substrate, a multilayer IC carrier substrate or a thin film process.

23. The method for increasing rejection of a band-pass filter of claim 20, wherein the inductive device and the capacitive device of the band-pass filter are implemented by lump elements or distributed elements in part or in total.

* * * * *